United States Patent [19]
Hikita et al.

[11] Patent Number: 5,115,216
[45] Date of Patent: May 19, 1992

[54] SURFACE ACOUSTIC WAVE FILTER INCLUDING SAW RESONATORS WITH TRANSMISSION SPACES THEREIN

[75] Inventors: Mitsutaka Hikita, Hachiouji; Toyoji Tabuchi, Tsukui; Kazuhito Kurosawa, Nakaminato; Nobuhiko Shibagaki, Kokubunji, all of Japan

[73] Assignee: Hitachi, Ltd., Tokyo, Japan

[21] Appl. No.: 335,140

[22] Filed: Apr. 7, 1989

[30] Foreign Application Priority Data

Apr. 11, 1988 [JP] Japan ................... 63-87380

[51] Int. Cl.$^5$ .................................... H03H 9/64
[52] U.S. Cl. ......................... 333/195; 310/313 B
[58] Field of Search ................... 333/195, 193; 310/313 R, 313 B, 313 C, 313 D

[56] References Cited

U.S. PATENT DOCUMENTS

| | | | |
|---|---|---|---|
| 4,144,507 | 3/1979 | Shreve | 333/191 |
| 4,166,258 | 8/1979 | Tseng | 333/195 |
| 4,249,146 | 2/1981 | Yen et al. | 333/195 |
| 4,492,940 | 1/1985 | Hikita | 333/195 X |
| 4,494,031 | 1/1985 | Barnes et al. | 310/313 R |
| 4,542,356 | 9/1985 | Nakazawa et al. | 333/195 |
| 4,734,664 | 3/1988 | Hikita et al. | 310/313 R |
| 4,742,319 | 5/1988 | Sone | 333/195 |
| 4,803,449 | 2/1989 | Hikita et al. | 310/313 R |

OTHER PUBLICATIONS

"Miniature Surface-Acoustic-Wave Filters", Andrew J. Slobodnik, Jr., et al., Proceedings of the IEEE, vol. 67, No. 1, Jan. 1979.

Primary Examiner—Eugene R. LaRoche
Assistant Examiner—Benny Lee
Attorney, Agent, or Firm—Kenyon & Kenyon

[57] ABSTRACT

Disclosed is a SAW filter employing a SAW resonator which is constructed of a plurality of pairs of electrode fingers formed on a piezoelectric substrate, and in which a plurality of SAW transmission spaces are included. The SAW transmission spaces do not have the function of exciting a SAW, and they have electric lengths which match the phases of SAWs excited by the resonator. In accordance with frequency characteristics required of the filter, such SAW transmission spaces are introduced into, for example, one of a plurality of SAW resonators located on the electric power input side of the filter.

30 Claims, 9 Drawing Sheets

SURFACE ACOUSTIC WAVE FILTER INCLUDING SAW RESONATORS WITH TRANSMISSION SPACES THEREIN

BACKGROUND OF THE INVENTION

1. Field of the Invention

The present invention relates to a filter which utilizes a surface acoustic wave (SAW), and more particularly to a SAW filter which is well suited to transmitters and receivers for mobile communications, especially for cellular radio. The SAW filter according to the present invention is applied to mobile communication equipments such as a pocket pager, mobile telephone and cordless telephone.

2. Description of the Related Art

A conventional SAW filter of the so-called transversal type has had a construction wherein an input interdigital transducer for converting an electric signal into a surface acoustic wave, and an output interdigital transducer for inverting the surface acoustic wave into an electric signal again are arranged on a piezoelectric substrate. An example of the SAW filter is stated in, e. g., Proceedings of IEEE, Vol. 67 (1979), pp. 129–146.

In the prior-art filter mentioned above, all the electric signals are once converted into surface acoustic wave signals by the input transducer, and the surface acoustic wave signals are inverted into the electric signals again by the output transducer. Therefore, loss attendant upon the processes of the conversion and the inversion is very heavy.

Moreover, when it is intended to input high electric power to such a filter, a surface acoustic wave of large amplitude is excited by the transducer due to the great input, so that migration (degradation or fatigue of metal) takes place in a very short time across the fingers of an interdigital electrode constituting the transducer of the filter (by way of example, in case of a filter for mobile telephone of 800 MHz band, the fingers of an aluminum electrode have a width of 1.1–1.2 μm and a film thickness of 0.1 μm). Since the progress of the migration leads even to the burnout or short-circuit of the electrode fingers, the input power to the filter needs to be suppressed below about 10 dBm ($x[dBm]=10\log\{x[mW]1[mW]\}$) in the 800 MHz band by way of example. The technical problem of the migration is an important one to be solved and the solution is indispensable to enhancement in the lifetime and reliability of transmitter and receiver.

In addition, the advent of various communication means represented by portable telephone sets, as a consequence of the recent progress of communication technology, remarkably heightens a demand for communication wavelength bands to be used for them. The necessity for realizing many types of communication within a limited number of available wavelength bands requires improvement in the frequency characteristics of the transmitters and receivers.

The technical themes stated above are considered to be highly important problems which must be addressed in the field of future communication technology.

SUMMARY OF THE INVENTION

It is an object of the present invention to provide an improved SAW filter which solves the technical problems mentioned above.

It is an additional object of the present invention is to provide a SAW filter which has novel frequency characteristics.

In order to accomplish the aforementioned objects and other objects which will become apparent later, the present invention operates as described below:

In accordance with one aspect of the present invention, there is provided a SAW filter comprising a SAW resonator contructed including a piezoelectric substrate, a first electrode pattern which is formed on the piezoelectric substrate and which has a plurality of electrode fingers electrically connected to one another, and a second electrode pattern which is formed on the piezoelectric substrate and which has a plurality of electrode fingers electrically connected to one another and interleavedly arranged between the plurality of electrode fingers of the first electrode pattern. The SAW resonator has a plurality of SAW transmission spaces for transmitting an excited SAW therein while keeping a uniformed phase of the SAW. Thus, a SAW filter whose upper and lower cutoff frequency characteristics are abrupt can be realized. Each of the SAW transmission spaces has an electric length which is greater than a half-wavelength (λ/2) of the surface acoustic waves to be excited. In order to make uniform the phase of the SAW which are excited within the SAW resonator, each of the SAW transmission spaces has a predetermined electric length in a direction of SAW propagation. Although the electric length depends upon the construction of the resonator, it is given as, for example, $$\frac{2m+1}{2}\lambda$$

or nλ (where m and n denote integers greater than zero). The wavelength λ of the SAW to be excited corresponds to the passband frequency of the SAW filter. Preferably the plurality of SAW transmission spaces are uniformly arranged in the SAW transmitting direction within the resonator.

In addition, as the number of the SAW transmission spaces is larger and as the electric length of each SAW transmission space is greater, the abruptness of the frequency characteristics is enchanced. The electrode fingers constituting the SAW resonator are usually in a number of 100–1000 pairs, and are preferably in a number of 200–400 pairs. When the number of the electrode fingers is small, resonator properties weaken. More specifically, SAW components which are emitted by the resonator increase to lower the Q factor of the resonator, with the result that the output/input ratio of the resonator which is proportional to the inverse number of the Q factor, becomes small. The SAW transmission spaces merely transmit the excited SAW, and they do not have the function of exciting a SAW. The AW filter constructed including the SAW resonator which has the plurality of SAW transmission spaces each having the predetermined electric length in the SAW transmitting direction (in general, this direction becomes perpendicular to the extending direction of the individual electrode fingers for the SAW excitation), brings forth remarkable improvements in the lower and upper cutoff frequency characteristics thereof and is effective especially as a band-pass or band-rejection SAW filter. The remarkable improvements in the frequency characteristics are embodied principally in the abruptness of the characteristics. This feature affords an increase in the number of available communication frequency bands. As the SAW resonator of the SAW filter according to the present invention, a one-port SAW resonator is available.

In accordance with a further aspect of the present invention, there is provided a SAW filter comprising a plurality of SAW resonators, at least one of which is a SAW resonator having the plurality of SAW transmission spaces. Such a combined SAW filter increases the flexibility of design, and is especially suited to attain desired frequency characteristics.

In accordance with still a further aspect of the present invention, there is provided a SAW filter wherein among the plurality of SAW resonators, one located on an electric power input side is the SAW resonator having the plurality of SAW transmission spaces. Such a SAW filter improves various characteristics, especially impedance characteristics, which are required of the SAW filters of transmitters and receivers for use in the cellular radio.

In accordance with yet another aspect of the present invention, there is provided a SAW filter comprising a first SAW resonator which is disposed on an electric power input side, and a second SAW resonator which is disposed on an electric power output side, wherein at least one of the SAW resonators is the SAW resonator having the plurality of SAW transmission spaces, and the SAW resonators are electrically connected in series with each other. By disposing the SAW resonators separately on the power input and output sides, the electric power ratio of the pass frequency or attenuation frequency of the SAW filter can be enlarged.

In accordance with yet a further aspect of the present invention, there is provided a SAW filter wherein the first and second SAW resonators are electrically connected through a capacitor. A gap capacitor is available as the capacitor. The presence of the capacitor, is responsible for the fact that an attenuation value outside a band can be remarkably increased.

In accordance with yet a still further aspect of the present invention, there is provided a SAW filter comprising a third SAW resonator which is connected in cascade with the first SAW resonator or the second SAW resonator as viewed from the input side or output side of said filter. The third SAW resonator enlarges the attenuation value of a lower frequency side in the frequency characteristics of the SAW filter.

In accordance with a still further aspect of the present invention, there is provided a SAW filter wherein a third SAW resonator is respectively disposed on said input side and said output side.

In accordance with another aspect of the present invention, there is provided a SAW filter wherein the SAW resonator having the plurality of SAW transmission spaces includes a third electrode pattern which has a plurality of electrode fingers electrically connected in common, the electrode fingers being respectively interleaved between the first electrode pattern which has the plurality of electrically connected electrode fingers and the second electrode pattern which has the plurality of electrically connected electrode fingers. This SAW filter is effective especially as a high impedance filter. With the aforementioned construction wherein the third SAW resonators are respectively disposed on the input side and the output side, the attenuation value of the lower frequency side is more increased, and favorable frequency characteristics are realized.

In accordance with still another aspect of the present invention, there is provided a SAW filter wherein at least one further SAW resonator is connected electrically in series between the first SAW resonator and the second SAW resonator. Such a SAW resonator increases the attenuation value of the higher frequency side of the frequency characteristics of the SAW filter. When the SAW resonator has still another SAW resonator connected in cascade therewith, the attenuation value of the lower frequency side can be simultaneously increased.

In accordance with another aspect of the present invention, there is provided a SAW filter comprising a SAW resonator including a piezoelectric substrate, and a plurality of SAW excitation portions which are configured of a plurality of pairs of electrode fingers formed on said piezoelectric substrate, the respective SAW excitation portions being spacedly arranged to keep uniformed phases of SAW excited by them may come into agreement. The spacing between the respectively adjacent excitation portions is given by $$\frac{2m+1}{2}\lambda$$

or $n\lambda$, depending upon how to construct the SAW resonator. Here, $\lambda$ denotes the wavelength of the SAW corresponding to a frequency contained in the pass frequency band of the SAW filter. More concretely, the wavelength $\lambda$ corresponds to the center frequency of the pass frequency band required of the SAW filter. In order to excite the SAW at such a wavelength, the plurality of electrode fingers of the SAW excitation portion are disposed at intervals of $\lambda/2$. It is accordingly important that the spacing (electric length) between the SAW excitation portions is greater than $\lambda/2$.

One advantage of the present invention is that a SAW filter having abrupt lower and upper cutoff frequency characteristics can be realized.

Another advantage of the present invention is that a SAW filter with a structure easily realizing desired frequency characteristics; which are not uniquely determined by the piezoelectric characteristics of a substrate can be realized.

Still further advantages of the present invention will become apparent to those of ordinary skill in the art upon reading and understanding the following detailed description of the present invention.

BRIEF DESCRIPTION OF THE DRAWINGS

The invention may take form in various parts and arrangements of parts. The drawings are only for purposes of illustrating the preferred embodiments and are not to be construed as limiting the invention.

FIGS. 8A–8C are diagrams each showing the arrangement of a one-port SAW resonator, in which FIG. 8A illustrates a prior-art resonator and FIGS. 8B and 8C illustrate resonators used in the filters of the present invention;

DETAILED DESCRIPTION OF THE PRESENT INVENTION

The present invention will be described in detail by revealing the preferred embodiments thereof with reference to the drawings.

EXAMPLE 1

Figure 1:
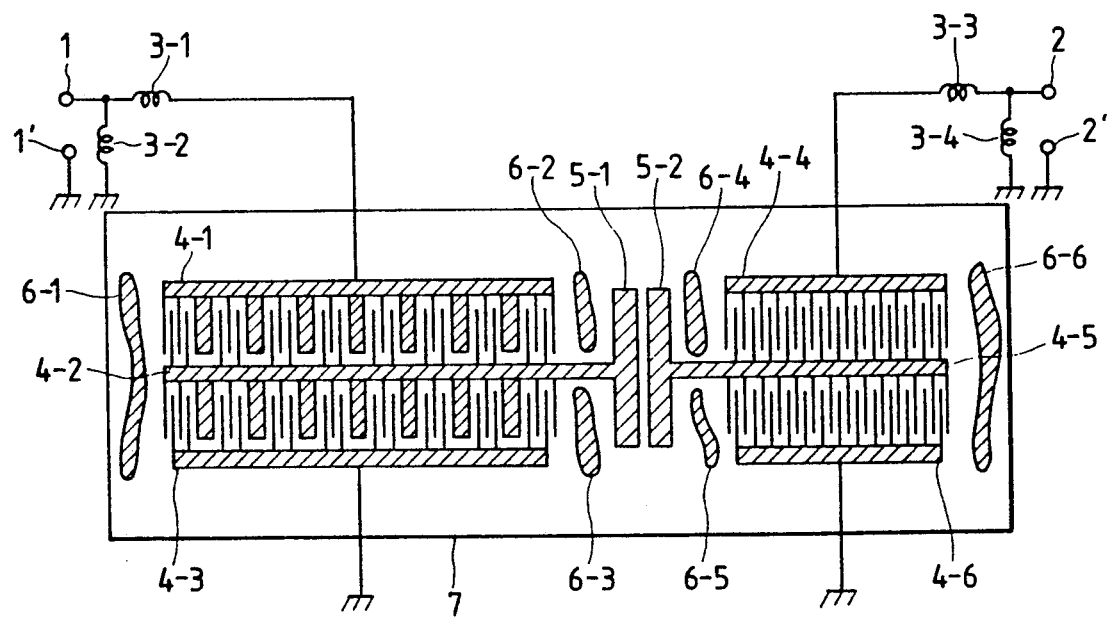
FIG. 1 is a schematic arrangement diagram showing an embodiment of a SAW (surface acoustic wave) filter according to the present invention.

FIG. 1 is an arrangement diagram of one embodiment of the filter of the present invention. The embodiment is an example in which a combined resonator filter is formed in such a way that four one-port SAW (surface acoustic wave) resonators configured of metal electrodes 4-1, 4-2, 4-3, 4-4, 4-5 and 4-6 and a single gap capacitor configured of electrode patterns 5-1 and 5-2 are provided on a piezoelectric substrate 7 capable of transmitting a SAW. Symbols 1 and 1' denote terminals for an electric power input, while symbols 2 and 2' denote terminals for an electric power output. Here, each of the resonators is constructed of an interdigital transducer which is made up of a large number of pairs of metal electrode fingers interleaved to one another. Even when no reflectors exist on both the sides of the transducer, vibration energy is confined within the transducer by internal reflections based on the electrode fingers thereof themselves, so that the transducer serves as the resonator of one port. This one-port type will be exemplified below.

Figure 3A:
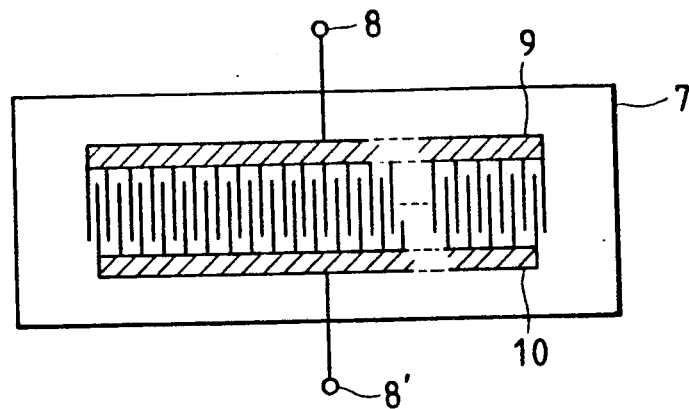
FIG. 3A is a diagram showing a schematic arrangement of a conventional one-port SAW resonator.
Figure 3B:
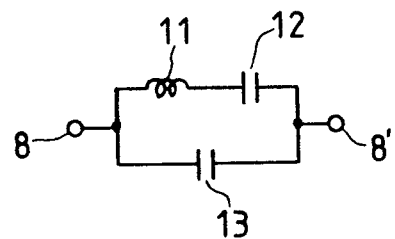
FIG. 3B is a diagram showing the equivalent circuit of the SAW resonator of FIG. 3A

The electrical equivalent circuit of such a one-port SAW resonator (FIG. 3A) is as shown in FIG. 3B. In FIGS. 3A–3C, 7 denotes a piezoelectric substrate; 8,8' denote terminals; 9,10 denote electrodes; 11 denotes an inductance; 12,13 denote capacitances; $f^r$ denotes resonant frequency of the resonator shown in FIG. 3A; $f^a$ denotes antiresonant frequency of the resonator shown in FIG. 3A and Im(z) denotes imaginary part of impedance Z of the circuit shown in FIG. 3B. With this expression, the filter in FIG. 1 is given by an equivalent circuit shown in FIG. 4, that is, an equivalent circuit arranged such that a series arm resonator which consists of an equivalent inductance 11-1, an equivalent capacitance 12-1 and a capacitance 13-1, and a shunt arm resonator which consists of an equivalent inductance 11-2, an equivalent capacitance 12-2 and a capacitance 13-2, the series and shunt arm resonators being connected in cascade as viewed from the input side, is connected through a gap capacitor 14 with a series arm resonator which consists of an equivalent inductance 11-4, an equivalent capacitance 12-4 and a capacitance 13-4, and a shunt arm resonator which consists of an equivalent inductance 11-3, an equivalent capacitance 12-3 and a capacitance 13-3, the series and shunt arm resonators being similarly connected in cascade as viewed from the output side. In FIG. 1, symbols 6-1 thru 6-6 denote pieces of an acoustic material which serve to prevent SAWs excited by the SAW resonators, from traveling into the other SAW resonators. The acoustic material pieces are not always necessary in the performance of the present invention. The filter of the present invention shown in FIG. 1 is characterized by a construction wherein each of the series arm resonator and shunt arm resonator on the input side includes therein a plurality of transmission spaces each having an electric length not less that the wavelength of a SAW which can be transmitted at the pass-band frequency of the filter. (By the way, in FIGS. 1 and 4, inductances 3-1, 3-2, 3-3 and 3-4 indicate external matching circuits.)

Figure 4:
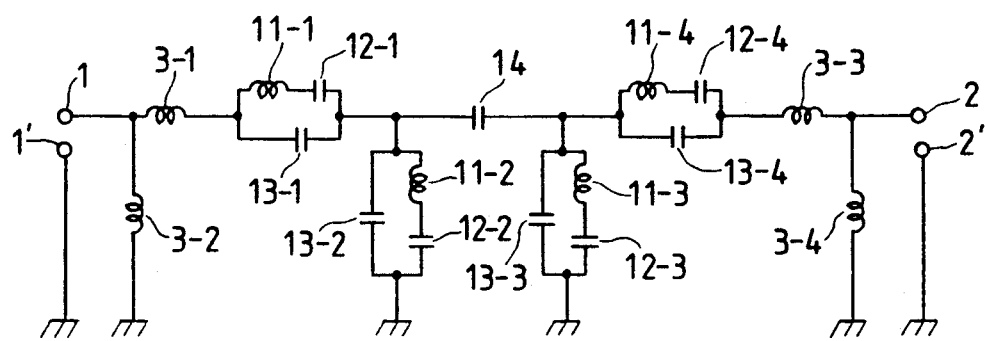
FIG. 4 is a diagram showing an equivalent circuit of the filter of the present invention illustrated in FIG. 1.
Figure 5:
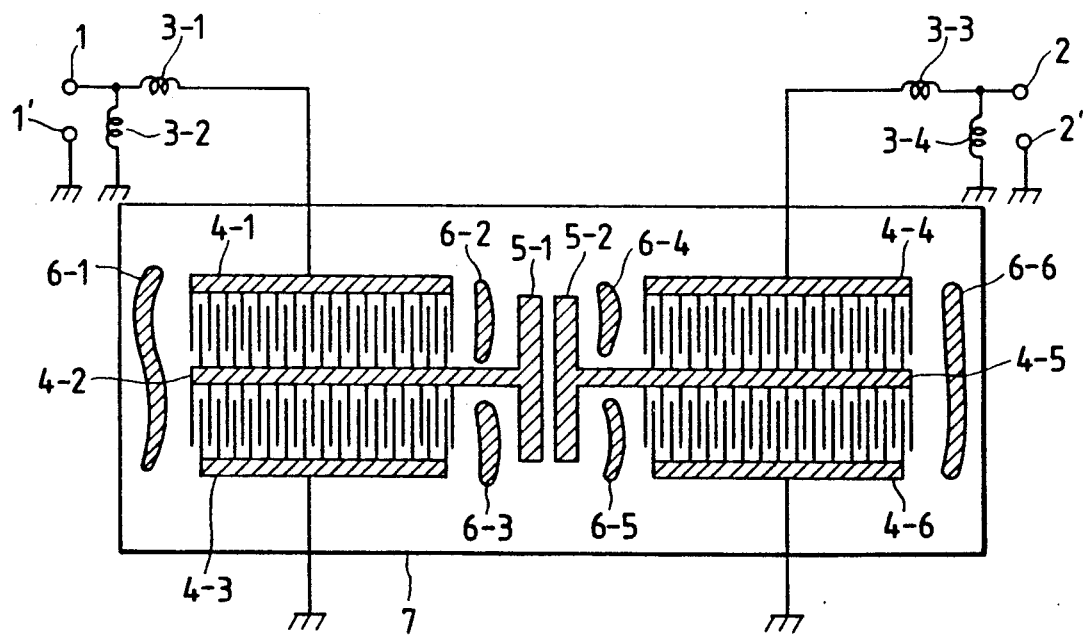
FIG. 5 is a diagram showing an arrangement of a prior-art filter.

FIG. 5 shows a prior art example of arrangement of a combined resonator filter which was earlier proposed by the present inventors. In this arrangement, both a series arm resonator and a shunt arm resonator on an input side are constructed of interdigital transducers each being configured of simple electrode fingers in a large number of pairs, similarly to resonators on an output side. When the arrangements in FIG. 1 and FIG. 5 are compared, the resonators on the output sides are the same, but the electrode constructions of the series arm resonators and shunt arm resonators on the input sides are different. The filter of the arrangement in FIG. 5 is expressed by the equivalent circuit shown in FIG. 4. In the arrangements of FIG. 1 and FIG. 5, however, the values of the respective constituents (inductances and capacitances) of the series arm resonators and shunt arm resonators of the input sides are different.

In the present invention, a SAW filter need not always be constructed of a plurality of SAW resonators. For some characteristics required the filter may well be constructed of one series arm resonator and one shunt arm resonator. Increases in the number of series arm resonators and the number of shunt arm resonators result in enlarging attenuation values on a higher frequency side and a lower frequency side, respectively. For the present invention which attains frequency characteristics exhibiting abrupt lower cutoff and upper cutoff, it is a favorable aspect to include at least two series arm resonators and at least two shunt arm resonators. In an extreme case, even a SAW filter constructed of only one SAW resonator can be realized.

Figure 6A:
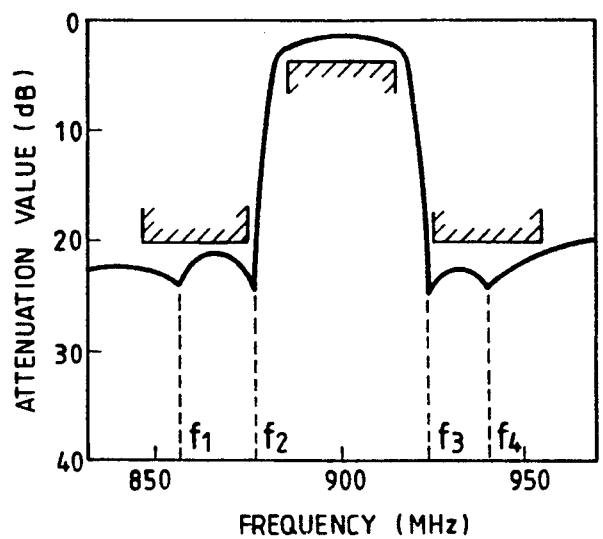
FIG. 6A is a graph showing the pass characteristics of the filter of the present invention shown in FIG. 1.
Figure 6B:
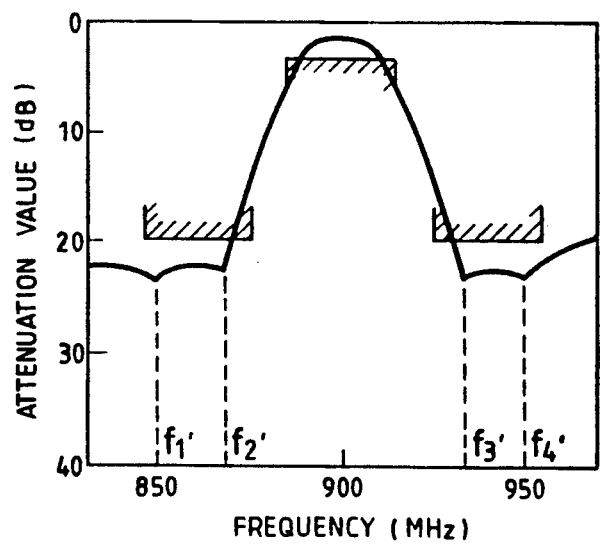
FIG. 6B is a graph showing the pass characteristics of the filter depicted in FIG. 5.

Here, results obtained by simulating frequency characteristics with a computer as to the filter of the arrangement in FIG. 1 and the filter of the arrangement in FIG. 5 are illustrated in FIGS. 6A and 6B. Here, using as an example, the frequency allocation (800 MHz) of a mobile telephone used in parts of Europe is taken as an example. FIG. 6A shows the frequency characteristics of the filter based on the arrangement of the present invention in FIG. 1, while FIG. 6B shows the frequency characteristics of the filter based on the arrangement in FIG. 5. It is understood from these results that a filter which has very abrupt lower and upper cutoff frequency characteristics and whose loss is low can be realized owing to the filter of the arrangement of the present invention in FIG. 1. With the filter of the arrangement in FIG. 5, abrupt lower and upper cutoff frequency characteristics capable of meeting specifications cannot be attained. Although the loss of this filter is low at the central part of a pass band required, only results inferior to specifications are attained on both the sides thereof.

When FIGS. 6A and 6B are compared, poles $f_1'$, $f_2'$ on a lower frequency side and poles $f_3'$, $f_4'$ on a higher frequency side are respectively existent also in FIG. 6B, in correspondence with poles $f_1$, $f_2$ on a lower frequency side and poles $f_3$, $f_4$ on a higher frequency side in FIG. 6A. However, an important point of difference is that $f_2 > f_2'$ and $f_3 < f_3'$ hold. In general, the realization of abrupt lower and upper cutoff frequency characteristics is determined by the extent to Which the poles nearest to the pass band the poles $f_2$, $f_3$ in FIG. 6A, and the poles $f_2'$, $f_3'$ in FIG. 6B) can be approached to the pass band without affecting pass-band characteristics. As compared with FIG. 6A, in FIG. 6B, the loss of the lower frequency side of the pass band increases as a result of the fact that the lower and upper cutoff frequency characteristics is gently-sloping in spite of $f_2 > f_2'$. Also on the higher frequency side, the loss similarly increases as a result of the fact that the lower and upper cutoff frequency characteristics is gently-sloping in spite of $f_3 < f_3'$.

Next, the differences of the characteristics in FIG. 6A and FIG. 6B will be described in correspondence with the differences of the filter arrangements in FIG. 1 and FIG. 5. The pole $f_2$ close to the pass band on the lower frequency side in FIG. 6A is formed by the shunt arm resonator of the input side in FIG. 1 (corresponding to the elements 11-2, 12-2 and 13-2 of the equivalent circuit in FIG. 4). That is, the resonant frequency of the shunt arm resonator agrees with the pole $f_2$. On the other hand, the pole $f_3$ close to the pass band on the higher frequency side in FIG. 6A is formed by the series arm resonator in FIG. 1 (corresponding to the elements 11-1, 12-1 and 13-1 in FIG. 4). That is, the antiresonant frequency of the series arm resonator agrees with the pole $f_3$. Likewise, the other poles $f_1$ and $f_4$ of the lower frequency side and higher frequency side agree with the resonant frequency of the shunt arm resonator and the antiresonant frequency of the series arm resonator of the output side in FIG. 1, respectively. Quite the same relations is made up between the characteristics in FIG. 6B and the filter arrangement in FIG. 5. The poles $f_2'$ and $f_3'$ close to the pass band agree with the resonant frequency of the shunt arm resonator and the antiresonant frequency of the series arm resonator of the input side in FIG. 5, respectively, while the other poles $f_1'$ and $f_4'$ agree with the resonant frequency of the shunt arm resonator and the antiresonant frequency of the series arm resonator of the output side, respectively.

As understood from the above description, the differences between the filter of the arrangement in FIG. 1 and the filter of the arrangement in FIG. 5 lie in the different constructions of the series arm resonators and shunt arm resonators of the input sides. More specifically, the characterizing feature of the filter of the arrangement of the present invention in FIG. 1 is that the plurality of transmission spaces each having the electric length not less than the wavelength of the SAW which can travel at the pass-band frequency of the filter are included within the one-port SAW resonator. Owing to the use of the one-port SAW resonators of such construction, even when the corresponding poles $f_2$ and $f_3$ in FIG. 6A are formed near the pass band of the filter, influences on the pass-band characteristics of the filter can be rendered sufficiently small, and a filter having very abrupt lower and upper cutoff frequency characteristics can be fabricated. In this embodiment, the electric length of the SAW transmission space as stated above is given by $n\lambda$. Here, n denotes an integer of at least one, and $\lambda$ denotes the wavelength of the SAW which is excited in correspondence with the center wavelength of the pass-band frequencies of the filter. Regarding the definition of frequencies fr and fa, "fr" denotes resonant frequency of the resonator shown in FIG. 3C and "fa" denotes antiresonant frequency of the resonator shown in FIG. 3C. It is important that such SAW transmission spaces have electric lengths which match the phases of SAWs to be excited, in other words, electric lengths which transmit the SAWs while keeping the uniformed phases. In the second embodiment to be described later, the length of each SAW transmission space is $$\frac{2m+1}{2}\lambda$$

(where m denotes an integer of at least one). Incidentally, in the present invention, the electric length may be approximately equal to $n\lambda$ $$\left(\text{or } \frac{2m+1}{2}\lambda\right),$$

and $n(\lambda \pm \Delta\lambda)$ $$\left(\text{or } \frac{2m+1}{2}(\lambda \pm \Delta\lambda)\right)$$

is available within a range of $$0 \leq \frac{\Delta\lambda}{\lambda} \leq 0.2.$$

In the case where the one-port SAW resonators of the conventional structure are employed on the input side as in the arrangement of FIG. 5, even when the corresponding poles $f_2'$ and $f_3'$ are sufficiently spaced from the pass band of the filter, the pass-band characteristics of the filter are affected, and abrupt lower and upper cutoff frequency characteristics cannot be realized, as seen from FIG. 6B.

Figure 3C:
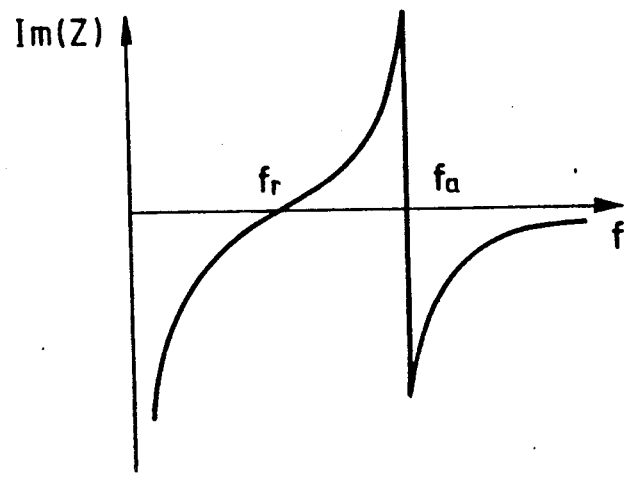
FIG. 3C is a graph showing the frequency characteristics of the impedance of the SAW resonator FIG. 3A.

Next, there will be described the constructions of the resonators forming the point of difference between the arrangement in FIG. 1 and the arrangement in FIG. 5. FIG. 3A is a diagram showing the schematic structure of the conventional one-port SAW resonator which is constructed of the interdigital transducer configured of the simple electrode fingers in the large number of pairs. As shown in FIG. 3B, the equivalent circuit of this resonator is expressed by a parallel connection consisting of a capacitance 13 which is disposed between the electrode fingers and an inductance 11 and a capacitance 12 in series whose characteristics are due to elastic vibrations. In addition, the frequency characteristics of the impedance (Z) of this circuit become $Z \approx 0$ at the resonant frequency (fr) and $Z \approx \infty$ at the antiresonant frequency (fa) as illustrated in FIG. 3C.

Figure 7A:
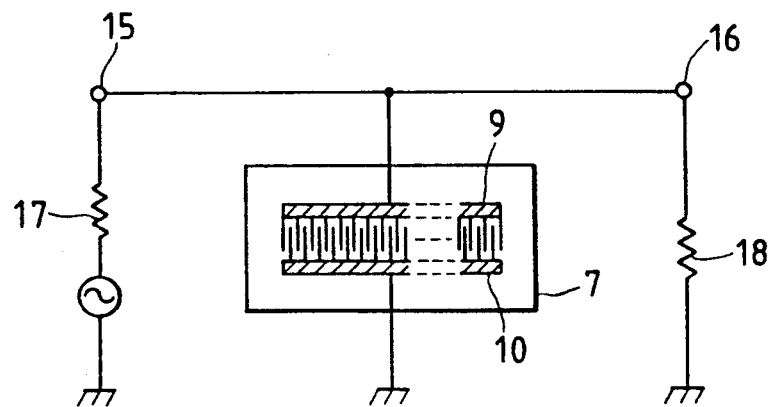
FIGS. 7A and 7B are diagrams showing circuits which include one-port SAW resonators in a shunt arm and in a series arm, respectively.
Figure 7B:
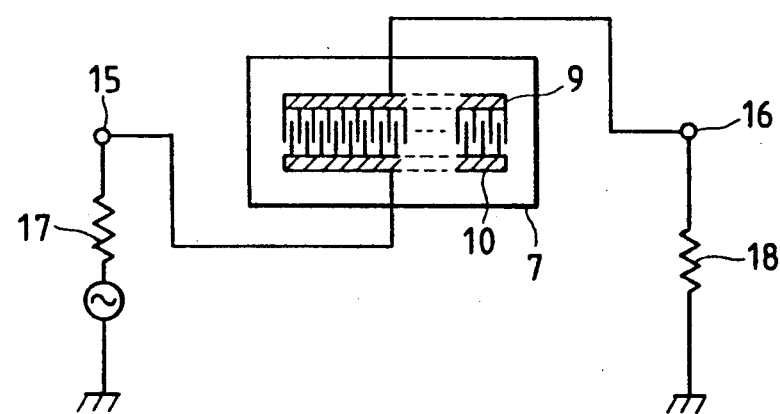
Figure 10A:
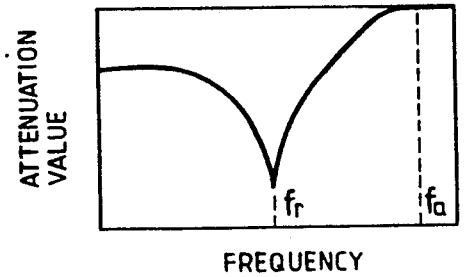
FIGS. 10A–10C are graphs showing the pass characteristics of the circuit depicted in FIG. 7A.
Figure 10B:
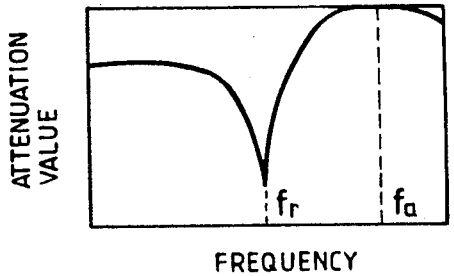
Figure 10C:
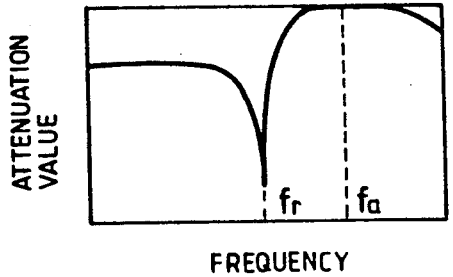

Here, in order to further describe the relationship between the construction of the resonator and the transfer characteristics of the filter, we will consider a circuit in which the resonator in FIG. 3A is introduced into the shunt arm between a power source and a load as shown in FIG. 7A. In FIGS. 7A and 7B, 7 denotes a piezoelectric substrate; 9,10 denote electrodes; 15 denotes a node between the power source and the resonator; 16 denotes a node between the load and the resonator; 17 denotes resistance of the power source; and 18 denotes the load. The transfer characteristics of such a circuit has a so called "stop band" at the resonant frequency (fr) of the resonator because of $Z \approx 0$, not affected at the antiresonant frequency (fa) because of $Z \approx \infty$. Additionally, the condition of $Z \approx \infty$ means that the imaginary part of the impedance Z (complex number) becomes zero and a frequency at such point as the stop band is called the resonant frequency. FIG. 10A illustrates these transfer characteristics, and as seen from the figure, the interval between the frequencies fr and fa determines the leading edge part of the transfer characteristics of the filter. As shown in FIGS. 10B and 10C by way of example, the lower cutoff frequency characteristics can be rendered increasingly abrupt by approaching the frequencies fr and fa.

Besides, in the one-port SAW resonator of the structure in FIG. 3A, the frequencies fr and fa are determined by the piezoelectric effect of a piezoelectric substrate which is used. By way of example, with a substrate of high piezoelectric effect such as $LiNbO_3$ substrate or $LiTaO_3$ substrate, the interval of the frequencies fr and fa is great, so that the leading edge part of the transfer characteristics is gentle and becomes as shown in FIG. 10A. In contrast, with a substrate of low piezoelectric effect such as quartz substrate, the interval of the frequencies fr and fa is very small, so that the leading edge part of the transfer characteristics becomes abrupt to afford the characteristics as shown in FIG. 10B or FIG. 10C.

In view of the above, in order to realize the filter of the characteristics as shown in FIG. 6A, the pole $f_2$ corresponding to the abrupt lower cutoff frequency characteristics may be formed by a resonator having the characteristics illustrated in FIG. 10C, and the pole $f_1$ corresponding to wide-band frequency characteristics may be formed by a resonator having the characteristics illustrated in FIG. 10A. In principle, it is possible to obtain the above construction in such a way that a plurality of one-port SAW resonators which are respectively formed on substrates of unequal piezoelectric effects, for example, $LiNbO_3$ and quartz substrates, are combined by wire bonding or the like. However, the combination of the plurality of resonators formed on the different substrates is impractiable in consideration of a manufacturing process, assembly, packaging, etc.

The present invention has overcome these problems, and has realized resonators which are equivalently endowed with the transfer characteristics corresponding to FIGS. 10A, 10B and 10C, by the use of a single piezoelectric substrate and on the basis of the electrode constructions of the resonators. A filter having abrupt lower and upper cutoff frequency characteristics as shown in FIG. 6A can be realized in such a way that a plurality of one-port SAW resonators formed on an identical substrate are coupled by electrode patterns etc.

Figure 8A:
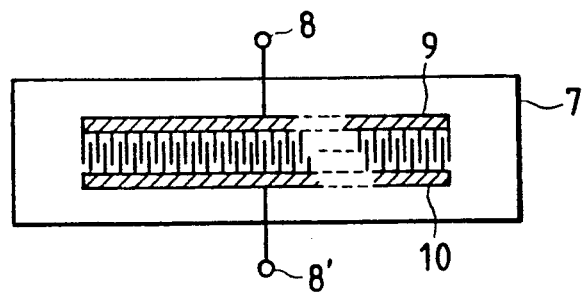
Figure 8B:
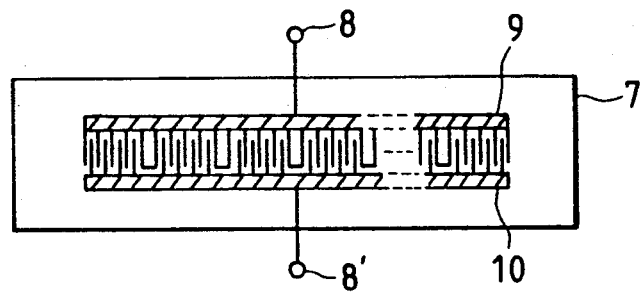
Figure 8C:
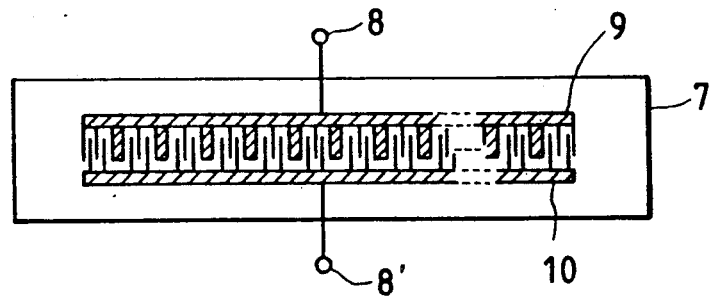
Figure 9A:
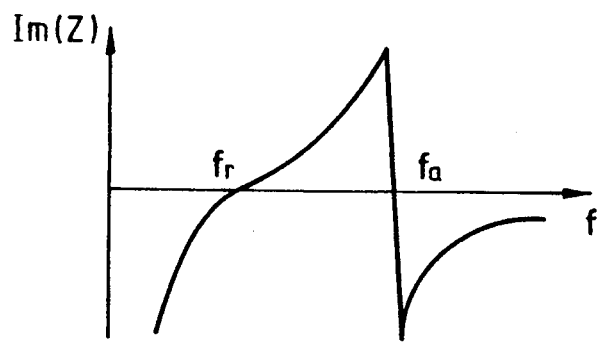
FIGS. 9A, 9B and 9C are graphs showing the frequency characteristics of the impedances of the resonators depicted in FIGS. 8A, 8B and 8C, respectively.
Figure 9B:
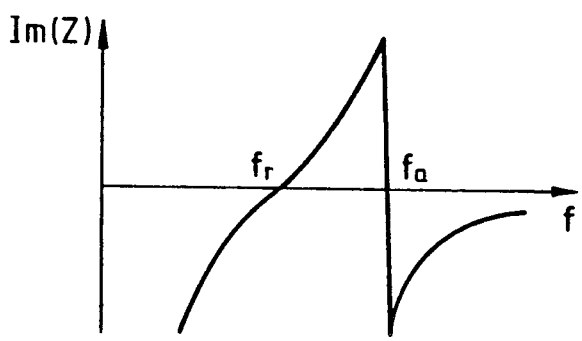
Figure 9C:
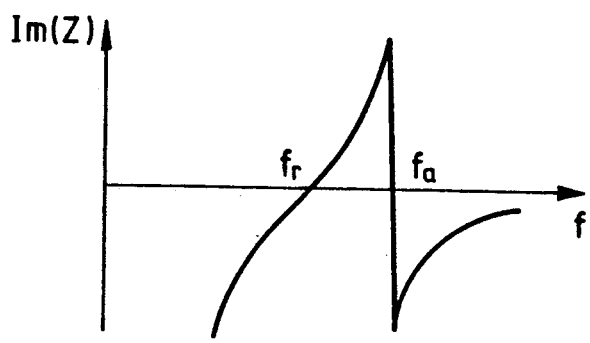

FIGS. 8A–8C show examples of the series arm resonator and shunt arm resonator on the input side. In FIGS. 8A–8C, 7 denotes a piezoelectric substrate; 8,8' denote terminals; and 9,10 denote electrodes. FIG. 8A exemplifies the conventional one-port SAW resonator which is constructed of the interdigital transducer configured of only the simple electrode fingers in a large number of pairs, FIG. 8B exemplifies the one-port SAW resonator which includes therein a plurality of transmission spaces each having the electric length not less than the wavelength of the SAW, and in which one transmission space is included every fourth pair of electrode fingers, and FIG. 8C exemplifies the one-port SAW resonator which includes a plurality of transmission spaces similarly to the resonator in FIG. 8B, but in which one transmission space is included every second pair of electrode fingers. The frequency characteristics of the impedances of these resonators are as shown in FIGS. 9A, 9B and 9C, which correspond to FIGS. 8A, 8B and 8C, respectively. In view of the results in FIGS. 9A–9C, the intervals between the resonant frequencies (fr) and the antiresonant frequencies (fa) narrow in the order of the examples in FIGS. 8A, 8B and 8C, and in cases of employing these resonators as filter elements, it can be anticipated that filters having more abrupt lower and upper cutoff frequency characteristics will be fabricated in the order of the examples in FIGS. 8A, 8B and 8C. Examples of transfer characteristics in the cases of applying these resonators to the resonator portion in FIG. 7A are as shown in FIGS. 10A, 10B and 10C, which correspond to the characteristics in FIGS. 9A, 9B and 9C, respectively. From the results, it is understood that the lower cutoff frequency characteristics become more abrupt in the order of the characteristics in FIGS. 9A, 9B and 9C.

As thus far described, the frequencies fr and fa of the resonator can be brought nearer than in the conventional one-port SAW resonator by introducing into the resonator the plurality of SAW transmission spaces, each of which has the electric length $n\lambda$ (where $\lambda$ denotes the wavelength of the SAW, and n denotes an integer). In case of employing such a resonator, abrupt lower cutoff frequency characteristics are attained as the transfer characteristics of a filter. The reason why the interval between the frequencies fr and fa narrows in the resonator including the plurality of transmission spaces, will be described below.

In general, the excitation of a SAW is based on the fact that, when plus and minus high-frequency voltages are applied across mutually interleaved electrode fingers formed on a piezoelectric substrate, a strain appears in the surface of the substrate owing to the piezoelectric effect and travels as the SAW along the substrate surface. In the resonator of the construction in FIG. 3A, the interval of the frequencies fr and fa is determined by the piezoelectric effect of the piezoelectric substrate as stated before. By way of example, the fr - fa interval is wide with a substrate of high piezoelectric effect such as an $LiNbO_3$ or $LiTaO_3$ substrate, whereas it is narrow with a substrate of low piezoelectric effect such as a quartz substrate. Accordingly, the piezoelectric effect needs to be equivalently lowered by the electrode configuration of the resonator for the purpose of narrowing the fr - fa interval when the substrate of high piezoelectric effect such as the $LiNbO_3$ or $LiTaO_3$ substrate is used. In each of the resonators in FIGS. 8B and 8C, the piezoelectric effect is equvalently lowered in such a way that the plurality of SAW transmission spaces each having the electric length not less than the wavelength of the SAW are introduced into the resonator. Incidentally, although this embodiment shows the example in which comparatively broad metal stripes are formed in correspondence with the SAW transmission spaces, they may of course be omitted.

Further, the reason why the piezoelectric effect is equivalently lowered by introducing the transmission spaces into the resonator can be explained as follows: Although the electrode fingers mutually interleaved in the resonator function as excitation electrode fingers for exciting the SAW, the portions of the transmission spaces do not excite the SAW. The density of the excitation electrode fingers in the resonator becomes lower as the number of the transmission spaces is larger, and the lowering of the density of the excitation electrode fingers is equivalent to decrease in the piezoelectric effect of the substrate. Accordingly, the piezoelectric effect of the substrate can be virtually weakened by introducing such SAW transmission spaces into the resonator, and any desired value smaller than the inherent piezoelectric effect of the substrate can be equivalently attained by properly selecting the number of the transmission spaces. Owing to the above facts, both the resonators whose fr - fa intervals are wide and narrow can be realized by employing a single piezoelectric substrate and changing the construction of the resonators.

Figure 11A:
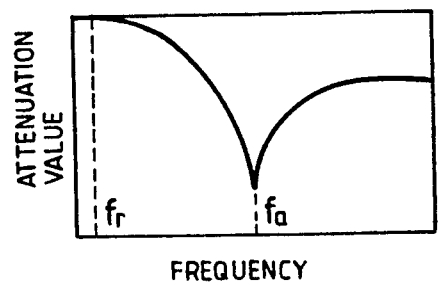
FIGS. 11A–11C are graphs showing the pass characteristics of the circuit depicted in FIG. 7B.
Figure 11B:
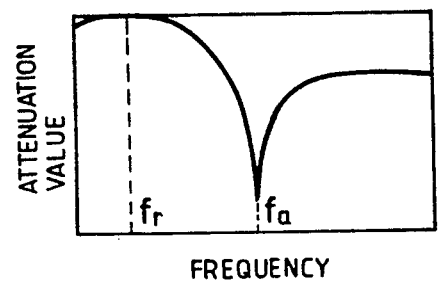
Figure 11C:
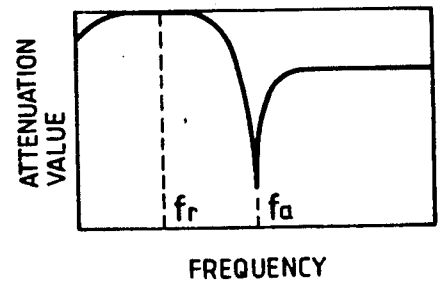

Next, let's consider a circuit in which, as shown in FIG. 7B, the resonator is introduced into the series arm between a power source and a load. The transfer characteristics of such a circuit are not affected in the vicinity of the resonant frequency (fr) of the resonator because of $Z \approx 0$, and become a pole at the antiresonant frequency because of $Z \approx \infty$. FIGS. 11A, 11B and 11C illustrate the transfer characteristics in the cases of employing the resonators in FIGS. 8A, 8B and 8C, respectively. It is understood from these results that, also on this occasion, abrupt lower cutoff frequency characteristics are attained by employing the resonators each having the plurality of SAW transmission spaces, quite similarly to the occasion of FIGS. 10A-10C.

As stated above, it is found that the combined SAW resonator filter of the arrangement in FIG. 1 and the combined SAW resonator filter of the arrangement in FIG. 5 have the clear differences in characteristics therebetween. In the case of the arrangement in FIG. 1, the filter is endowed with the frequency characteristics as shown in FIG. 6A by employing the resonators each of which includes the plurality of SAW resonators therein, and it is effective as filters for mobile telephone etc. of which very abrupt lower and upper cutoff frequency characteristics are required. In contrast, in the case of the arrangement in FIG. 5, the frequency characteristics become as shown in FIG. 6B, and the use as the filters of the abrupt frequency characteristics cannot be expected.

EXAMPLE 2

This embodiment concerns another example of construction of the one-port SAW resonator of the filter of the present invention.

Figure 2A:
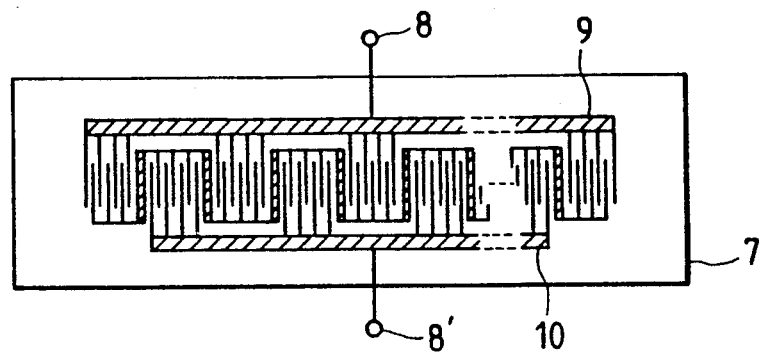
FIGS. 2A-2C are schematic arrangement diagrams each showing a one-port SAW resonator used in another embodiment of a filter of the present invention.
Figure 2B:
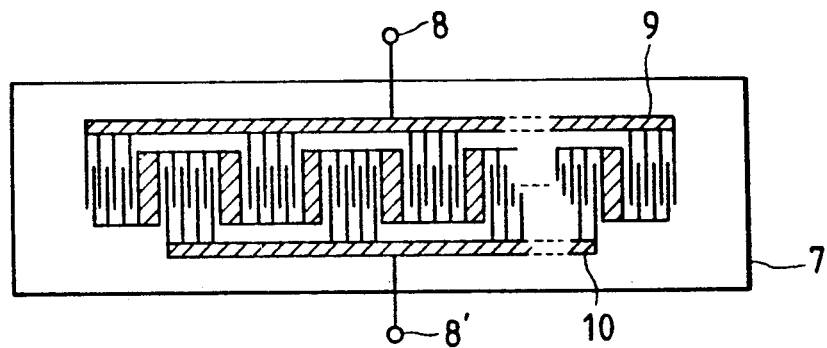
Figure 2C:
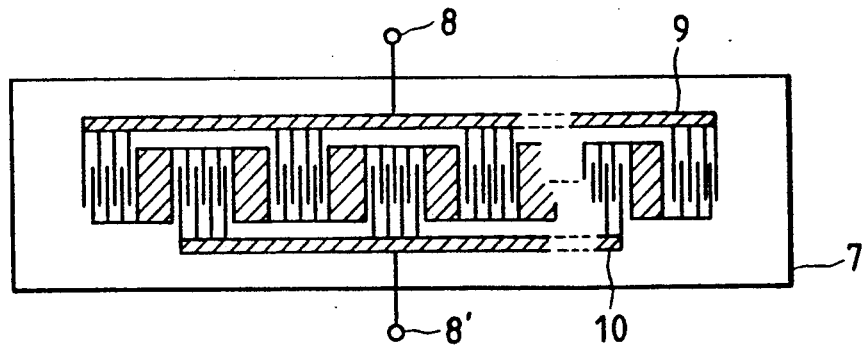

FIGS. 2A-2C show interdigital transducers each of which is configured of a large number of pairs of electrode fingers interleaved to one another. Here, 7 denotes a piezoelectric substrate; 8, 8' denote terminals and 9,10 denote electrodes respectively. Each of the figures illustrates a resonator in which some of the large number of SAW transducers laid out in the direction of transmitting a SAW are electrically connected in series or in a combined series and parallel relationship.

By way of example, the transducers in FIG. 2A will be referred to. Also in this case, when the number of the excitation electrode fingers is sufficiently large, a one-port resonator is formed as in the case of FIG. 3A. In addition, one characterizing feature of this resonator is that the impedance thereof becomes about four times in comparison with the impedance of the resonator of the prior-art construction in FIG. 3A, subject to the same number of electrode fingers. Accordingly, the resonator construction is promising for a high-impedance filter. Another characterizing feature of this resonator is that SAWs excited by the transducers which are arrayed in the direction of transmitting the SAWs and which are electrically connected in series come to have phases opposite to each other. Accordingly, a SAW transmission space which has an electric length equal to odd-number times the half of the wavelength of the SAWs $$\left( \frac{2m+1}{2} \lambda \right)$$

needs to be interposed between the transducers connected in series in order that the SAW excited by the adjacent transducers may be added in the same phase in the SAW transmitting direction.

When the resonator in FIG. 2A is concretely considered as an example in which a transmission space having an electric length equal to the half-wavelength of the SAW is interposed between the series-connected transducers, this resonator need not especially introduce the plurality of transmission spaces each having the electric length not less than the wavelength of the SAW as shown in FIG. 8B or FIG. 8C, for the purpose of approaching the resonant frequency (fr) and the antiresonant frequency (fa). The reason is that the transmission space having the electric length of the half-wave-length of the SAW as interposed between the adjacent series transducers functions similarly. In order to approach the frequencies fr and fa, the number of pairs of unit transducers to be connected in series may be decreased, and the number of the transducers in the resonator, namely, the number of the SAW transmission spaces may be increased. Thus, the effect equivalent to lowering the piezoelectric effect of the substrate can be achieved as in the construction of FIG. 8B or FIG. 8C.

FIGS. 2B and 2C show structures which are fundamentally the same as the structure in FIG. 2A, but in which SAW transmission spaces to be interposed between the series-connected transducers have an electric length of 3/2 of the wavelength of SAW and an electric length of 5/2 thereof, respectively. Increase in the electric length of each interposed transmission space brings forth an effect equivalent to increasing the number of the SAW transmission spaces, and the piezoelectric effect of the substrate can be lowered to narrow the fr - fa interval as in the case of FIG. 2A.

Although, in the above, the examples employing the one-port resonators shown in FIGS. 2A-2C and FIGS. 8A-8C have been described, it is to be understood that similar effects are achieved even with a resonator in which metal stripe arrays, recessed arrays such as grooves, or SAW reflectors formed by ion implantation or the like are introduced on both the sides of the resonator. Moreover, the substrate is not restricted only to the piezoelectric substrate, but a structure in which a piezoelectric thin film or the like is formed on a non-piezoelectric substrate such as of Si may well be used. However, even in case of using a structure in which a non-piezoelectric thin film is formed on the piezoelectric substrate, similar effects are achieved as a matter of course.

Although the invention has been described with reference to a surface acoustic filter having four resonators, it is to be appreciated that other filters are applicable, including the other resonators between the resonator on the power input side and the resonator on the power output side and the like.

The invention has been described with reference to the preferred embodiments. Obviously, other modifications and alterations will occur to those of ordinary skill in the art upon reading and understanding the present specification. It is intended that the invention be construed as including all such alterations and modifications insofar as they come with the scope of the appended claims or equivalent thereof.

We claim:

1. A SAW (surface acoustic wave) filter comprising:
   an input portion receiving input electric signals;
   an output portion emitting output electric signals;
   a plurality of SAW resonators being electrically connected so as to form a filter, each one of said plurality of resonators having a plurality of first and second electrode fingers interleavedly disposed on a piezoelectric substrate, a first SAW resonator generating surface acoustic waves in accordance with said input electric signals, and a second SAW resonator converting said surface acoustic waves into said output electric signal,
   wherein one of said plurality of resonators includes SAW transmission spaces being interposed between the first and the second electrode fingers, said transmission spaces having an electric length greater than a half-wavelength of the surface acoustic waves so as to transmit the surface acoustic waves generated in the resonators and equalize the surface acoustic waves as to have the same phase.

2. The filter as set forth in claim 1 wherein said SAW filter comprises at least one SAW resonator connected in series between said input and output portions and at least one SAW resonator which is connected in shunt from a point between said input and output portions and ground.

3. The filter as set forth in claim 1, wherein an electric length of said each SAW transmission space is substantially equal to $$\frac{2m+1}{2} \lambda$$

or $n\lambda$ where $\lambda$ denotes a wavelength of the SAW, and m and n denote integers.

4. The filter as set forth in claim 1 wherein said SAW transmission spaces of said one of said plurality of resonators are uniformly interposed in between the first and second electrode fingers.

5. The filter as set forth in claim 1 wherein a number of finger pairs consisting of the first and the second electrode fingers in said one resonator is in a range of 200–400.

6. The filter as set forth in claim 1, wherein said one of said plurality of resonators is a one-port type resonator.

7. The filter as set forth in claim 1 wherein said one SAW resonator having said plurality of SAW transmission spaces include a third electrode pattern which has a plurality of electrically connected electrode fingers respectively interleaved between a first electrode pattern of said first electrode fingers and a second electrode pattern of said second electrode fingers.

8. The filter as set forth in claim 1 wherein said one of said plurality of SAW resonators is said first resonator.

9. The filter as set forth in claim 1, wherein said first SAW resonator is disposed in an electric power input side and said second SAW resonator is disposed on an electric power output side, and wherein at least one of said first and said second SAW resonators has said plurality of SAW transmission spaces, and said first and said second resonators are serially connected to each other.

10. The filter as set forth in claim 9, wherein said first and second SAW resonators are electrically connected through a capacitor.

11. The filter as set forth in claim 9, wherein said filter comprises a third SAW resonator which is connected in cascade with at least one of said first and second SAW resonators.

12. The filter as set forth in claim 9 wherein said filter comprises a pair of third resonators with one of said third resonators being connected in cascade with said first SAW resonator and the other of said third resonators being connected in cascade with said second SAW resonator.

13. The filter as set forth in claim 9, wherein at least one further SAW resonator is connected electrically in series between said first SAW resonator and said second SAW resonator.

14. A SAW (surface acoustic wave) filter comprising:
    a plurality of SAW resonators, each one of said plurality of resonators having a plurality of electrode fingers being spacedly arranged on a piezoelectric substrate in a SAW propagation direction which is perpendicular to the electrode fingers, and one of said plurality of resonators also having SAW transmission spaces having a predetermined electric length greater than a half-wavelength of surface acoustic waves generated in the SAW resonators so as to transmit the surface acoustic waves generated in the resonators and equalize the surface acoustic wave as to have the same phase.

15. The filter as set forth in claim 14 wherein said one of said plurality of resonators having transmission spaces has third electrode fingers as a SAW excitation portion, which third electrode fingers are respectively interleaved between said first electrode fingers and said second electrode fingers.

16. The filter as set forth in claim 14, wherein said one of said plurality of resonators having SAW transmission spaces includes a plurality of first electrode fingers electrically connected in common and a plurality of second electrode fingers electrically connected in common.

17. The filter as set forth in claim 14 wherein said one of said plurality of SAW resonators is disposed on an electric power input side of said filter.

18. A SAW (surface acoustic wave) filter comprising:
    an input portion receiving input electric signals;
    an output portion emitting output electric signals; and
    a plurality of surface acoustic wave (SAW) resonators, each one of said plurality of SAW resonators including first and second electrode fingers being interleavedly disposed on a piezoelectric substrate, and having a resonant frequency and an antiresonant frequency respectively;

wherein each of said plurality of SAW resonators is electrically connected between said input portion and said output portion, and forming a filter construction, wherein at least one of said plurality of SAW resonators has SAW transmission spaces interposed between the respective electrode fingers, resulting in different intervals between the resonant frequency and the antiresonant frequency among the plurality of resonators.

19. The filter as set forth in claim 18, wherein said at least one SAW resonator having said plurality of SAW transmission spaces includes a third electrode pattern which has a plurality of electrically connected electrode fingers respectively interleaved between said first electrode fingers and said second fingers.

20. The filter as set forth in claim 18, wherein a first one of said plurality of SAW resonators is connected to said input portion and a second one of said plurality of SAW resonators is connected to said output portion, and wherein said first resonator has said plurality of SAW transmission spaces, and said first and second resonators are serially electrically connected to each other.

21. The filter as set forth in claim 20, wherein said first and second SAW resonators are electrically connected through a capacitor.

22. The filter as set forth in claim 20, wherein said filter further comprises a third SAW resonator which is connected in cascade with at least one of said first and second SAW resonators.

23. The filter as set forth in claim 20, wherein said filter further comprises a pair of third resonators, a first resonator of said pair being connected in cascade with said first SAW resonator and a second resonator of said pair of being connected in cascade with said second SAW resonator, respectively.

24. The filter as set forth in claim 20, wherein at least one further SAW resonator is connected electrically in series between said first SAW resonator and said second SAW resonator.

25. The filter as set forth in claim 18, wherein the SAW transmission spaces are uniformly interposed between the first and the second electrode fingers.

26. The filter as set forth in claim 18 wherein a number of finger pairs consisting of the first and second electrode fingers in said at least one of said plurality of resonators is in a range of 200–400.

27. The filter as set forth in claim 18, wherein one of said SAW resonators is a one-port type resonator.

28. The filter as set forth in claim 18, wherein an electric length of said each SAW transmission space is substantially equal to $$\frac{2m+1}{2}\lambda$$

or $n\lambda$ where $\lambda$ denotes a wavelength of the SAW, and m and n denote integers.

29. The filter as set forth in claim 18, wherein a first one of said plurality of SAW resonators is connected to said input portion and has said plurality of SAW transmission spaces.

30. The filter as set forth in claim 29, wherein at least one SAW resonator of said plurality of SAW resonators is connected in series between said input and output portions and at least another SAW resonator is connected in shunt from a point between said input and output portions and ground, and wherein at least one of said one and said another SAW resonators has said plurality of SAW transmission spaces, said plurality of SAW resonators being electrically connected to each other.

* * * * *

UNITED STATES PATENT AND TRADEMARK OFFICE
CERTIFICATE OF CORRECTION

PATENT NO. : 5,115,216  
DATED : May 19, 1992  
INVENTOR(S) : Mitsutaka Hikita et al Page 1 of 2

It is certified that error appears in the above-indentified patent and that said Letters Patent is hereby corrected as shown below:

| Column | Line | |
|---|---|---|
| 1 | 50 | Change "in" to --of--. |
| 2 | 24 | Change "surface" to --SAW--. |
| 2 | 25 | Delete "acoustic waves". |
| 2 | 26 | Change "SAW" to --surface acoustic waves--. |
| 2 | 56 | Change "AW" to --SAW--. |
| 3 | 38 | After "capacitor" delete ",". |
| 4 | 42 | After "characteristics" delete ";". |
| 4 | 64 | After "3A" insert --;--. |
| 6 | 40 | After "required" insert --,--. |
| 6 | 55 | Delete "using". |
| 6 | 56 | Delete "as an example". |

UNITED STATES PATENT AND TRADEMARK OFFICE
CERTIFICATE OF CORRECTION

PATENT NO. : 5,115,216
DATED : May 19, 1992
INVENTOR(S) : Mitsutaka Hikita et al It is certified that error appears in the above-indentified patent and that said Letters Patent is hereby corrected as shown below:

| Column | Line | |
|---|---|---|
| 7 | 13 | Change "Which" to --which--. |
| 7 | 20 | Change "is" to --are--. |
| 7 | 23 | Change "is" to --are--. |
| 7 | 44 | Change "is made up" to --exist--. |
| 9 | 10 | Before "not" insert --and are-- |
| 14 | 1 | Change "include" to --includes--. |
| 14 | 45 | Change "wave" to --waves--. |
| 16 | 1 | After "pair" delete "of". |

Signed and Sealed this

Twenty-eighth Day of December, 1993

BRUCE LEHMAN

Attest:

Attesting Officer

Commissioner of Patents and Trademarks